(12) United States Patent
Anantha Krishnan

(10) Patent No.: US 12,712,351 B2
(45) Date of Patent: Aug. 18, 2026

(54) DEVICE CABLE LENGTH ADJUSTMENT

(71) Applicant: Microsoft Technology Licensing, LLC, Redmond, WA (US)

(72) Inventor: Ahilan Anantha Krishnan, Mountain View, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 215 days.

(21) Appl. No.: 18/641,929

(22) Filed: Apr. 22, 2024

(65) Prior Publication Data

US 2025/0330007 A1 Oct. 23, 2025

(51) Int. Cl.
*H02G 11/02* (2006.01)
*B65H 75/44* (2006.01)
*H05K 5/02* (2006.01)

(52) U.S. Cl.
CPC ......... *H02G 11/02* (2013.01); *B65H 75/4428* (2013.01); *B65H 75/4486* (2013.01); *H05K 5/0217* (2013.01); *B65H 2511/11* (2013.01); *B65H 2511/17* (2013.01); *B65H 2701/34* (2013.01)

(58) Field of Classification Search
CPC ............ B65H 75/4428; B65H 75/4484; B65H 75/4486; B65H 2511/11; B65H 2511/17; B65H 2701/34
See application file for complete search history.

(56) References Cited

U.S. PATENT DOCUMENTS 4,427,033 A * 1/1984 Ege ......................... F16L 11/12 74/502.5
5,502,358 A * 3/1996 Lee .................... B65H 75/4486 242/420.5
5,647,554 A * 7/1997 Ikegami ................. B65H 75/38 191/12.2 A
7,331,436 B1 * 2/2008 Pack ....................... F41H 7/005 191/12.2 A
8,485,330 B2 7/2013 Pack
2004/0256188 A1 12/2004 Harcourt
2013/0032654 A1 * 2/2013 Tracey ..................... H02G 3/02 242/390.8
2014/0000322 A1 1/2014 Williams
2015/0343912 A1 12/2015 Mcnally
2015/0349555 A1 12/2015 Ortiz Baeza
2022/0065891 A1 3/2022 Wheeler
2022/0380186 A1 12/2022 Chao

FOREIGN PATENT DOCUMENTS

EP 4037120 B1 7/2023
WO 2020220050 A2 10/2020

OTHER PUBLICATIONS

Extended European search report received in European Application No. 25171621.3, mailed on Oct. 27, 2025, 9 pages.

* cited by examiner

*Primary Examiner* — Sang K Kim
(74) *Attorney, Agent, or Firm* — Alleman Hall LLP

(57) ABSTRACT

Examples are disclosed that relate to power supply devices and methods for adjusting a length of a device cable extending from the power supply device. In one example a method comprises, at a power supply device comprising a device cable, determining a cable property of the device cable. Based at least in part on the cable property of the device cable, actuating a motor in the power supply device to change the length of the device cable extending from the power supply device.

20 Claims, 12 Drawing Sheets

COMPUTING DEVICE 102

PROCESSOR 114

MEMORY 110

DEVICE CABLE LENGTH ADJUSTMENT

BACKGROUND

Power supplies use cables to connect electronic devices to power sources, such as electrical outlets. In different environments, cables that are too long or too short can create undesirable clutter and/or safety issues.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to power supply devices and methods for adjusting the length of a device cable extending from the power supply device. In one example, a method comprises determining a cable property of the device cable of a power supply device. Based at least in part on the cable property of the device cable, a motor in the power supply is device is actuated to change the length of the device cable extending from the power supply device.

DETAILED DESCRIPTION

Some electronic devices, such as laptops, tablets, mobile phones, and other computing devices, utilize a power supply to provide operating power and/or charge one or more internal batteries. Such power supplies are removably coupled to a device with a device cable and to a power source with a power cable. For example, a power supply for a computing device may utilize a male/female connector that allows a user to easily plug in or unplug the power supply from the computing device.

In different personal and professional environments, a power supply with a device cable that is too long can create tangled, unsightly messes as well as tripping hazards. On the other hand, some power supplies that utilize a device cable that is too short can restrict user movement and accessibility. In professional work settings where multiple devices may be in use, cable management becomes even more challenging.

Figure 1:
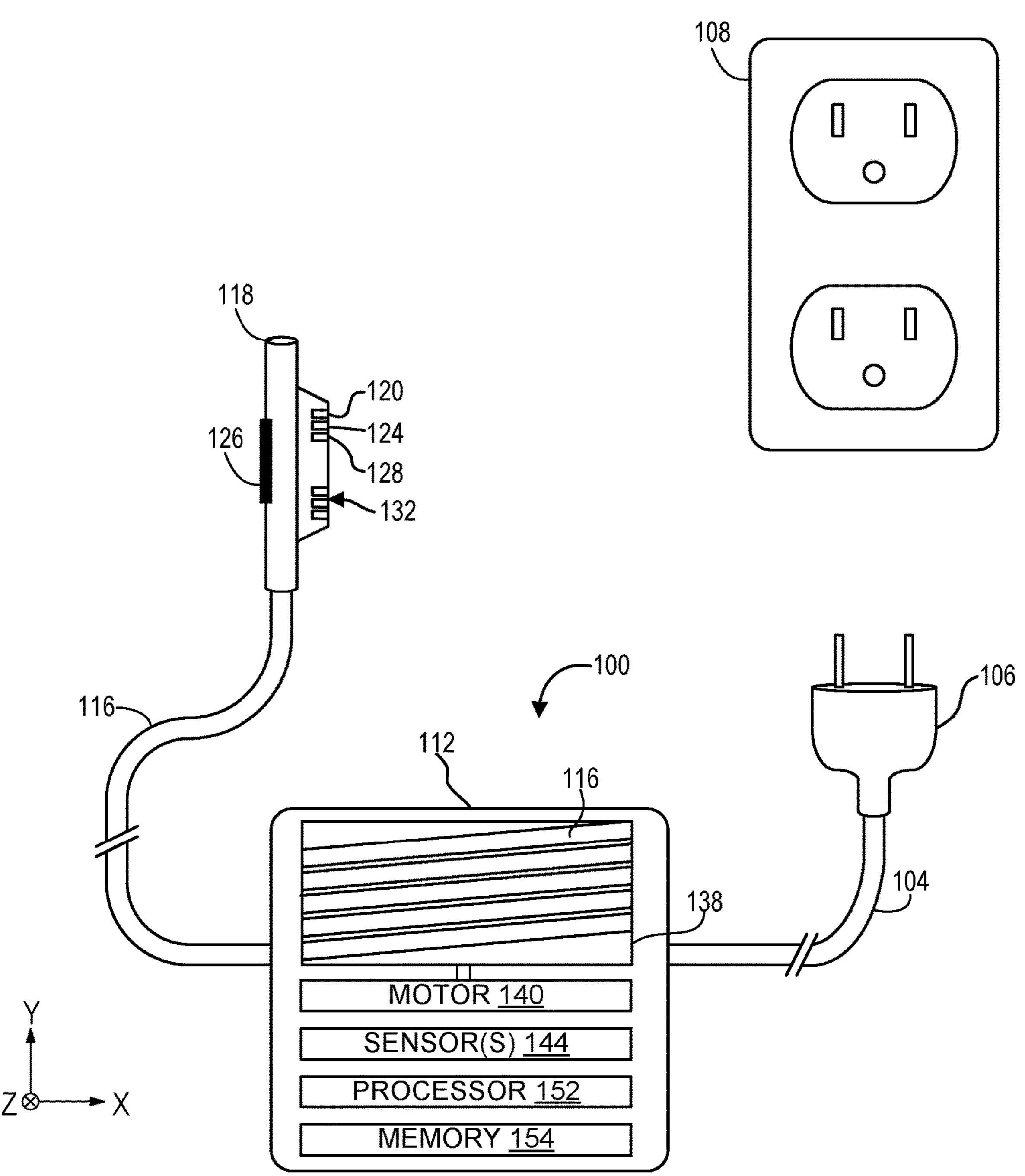
FIG. 1 shows an example of a power supply device according to examples of the present disclosure.

Accordingly, examples are disclosed that relate to power supply devices and methods for adjusting the length of a device cable. With reference now to FIG. 1, in one example, a power supply device 100 includes a power cable 104 and power connector 106 configured to plug into an electrical receptacle 108. In this example the power supply device 100 includes electrical components configured to transform electrical power supplied via the receptacle 108, such as 120V alternating current (AC), into low-voltage DC. In the example illustrated in FIG. 1, the power supply device 100 encloses such electrical components and other components inside enclosure 112.

Also extending from the power supply device 100 is a device cable 116 and device connector 118 configured to supply the low-voltage DC power to another device, such as via insertion into a mating slot in the other device. In this example the device connector 118 includes a power contact 120, a signal contact 124 and a ground contact 128. Additional power contacts, signal contacts, and ground contacts are also located on a bottom portion 132 of device connector 118. The additional power contacts, signal contacts, and ground contacts may be arranged symmetrically, such that the device connector 118 may be plugged into a device in a variety of orientations without impacting a polarity of the circuit. It will be appreciated that the illustrated device connector 118 is provided by way of example, and a wide variety of other device connectors having different form factors and/or different numbers and configurations of contacts can be utilized within the scope of the present disclosure. Similarly, power supply device 100 can utilize other form factors and configurations of enclosures within the scope of the present disclosure.

In this example, power supply device 100 includes a device cable spool 138 to which device cable 116 is attached and around with the device cable is wound. The device cable spool 138 is rotatably coupled to motor 140. As described in more detail below, and in one potential advantage of the present disclosure, in the power supply device 100 includes one or more sensors 144 configured to determine one or more cable properties of the device cable, including but not limited to tension, bending strain, and/or length of the device cable. Based at least in part on the cable property/properties of the device cable, motor 140 is actuated to rotate the device cable spool 138 to change the length of the device cable 116 extending from the power supply device.

In some examples, motor 140 comprises a rotary and linear actuator that rotates device cable spool 138 and translates the spool in the Y-axis direction to uniformly wind and unwind the device cable 116 from the spool. In other examples, any other suitable motor and spool combination configured to wind and unwind device cable 116 may be utilized, including but not limited to a lead screw comprising a keyed shaft that rotates and translates a device cable spool. In other examples, the spool can have a non-circular cross section and can be any other suitable shape, such as conical, etc. In other examples, any other suitable motor and mechanism configured to change the length of the device cable extending from the enclosure of a power supply device can be utilized. Examples can include but are not limited to reciprocating, linear motion configurations that fold the device cable into a compact footprint and a telescoping mechanism enclosing the device cable that causes extension and retraction of the cable.

Figure 2:
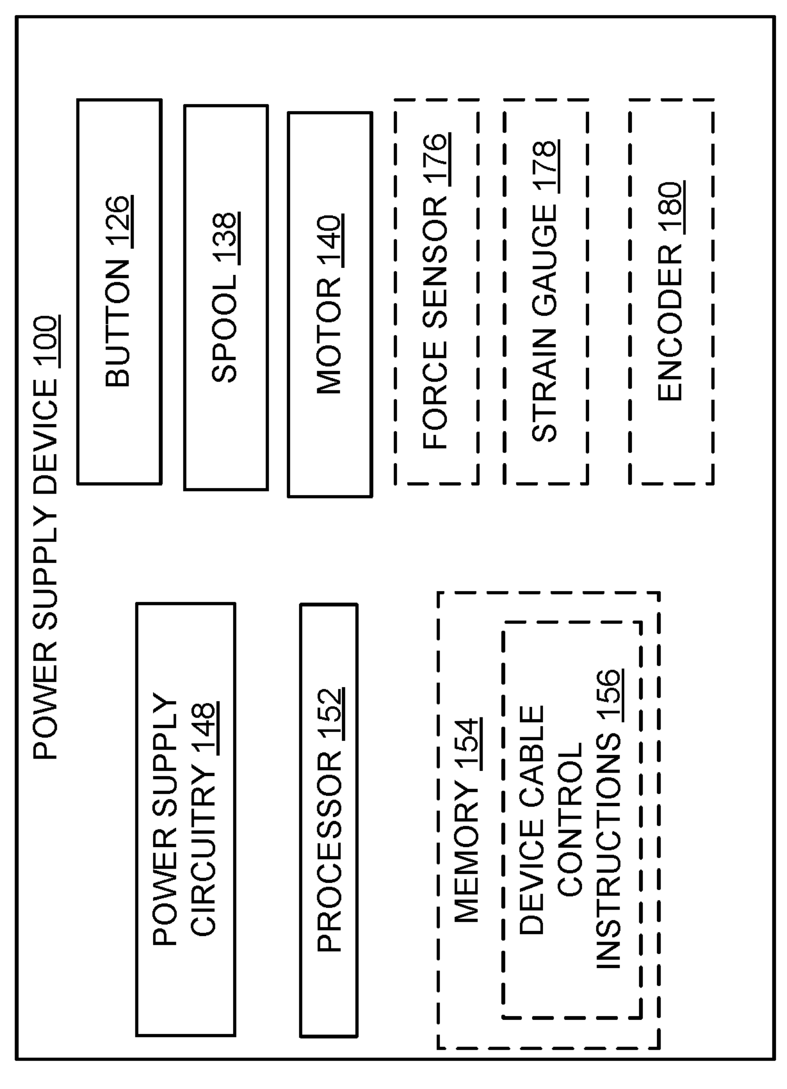
FIG. 2 shows a block diagram illustrating an example power supply device according to examples of the present disclosure.

With reference now to FIG. 2, a schematic diagram illustrates embodiments of power supply device(s) 100 and computing device(s) 102 to which power supply device can be coupled. In this example power supply device 100 includes power supply circuitry 148 that transforms electrical power supplied from a power source, such as 120V AC, into low-voltage DC that is supplied to computing device 102. As described in more detail below, in some examples power supply device 100 also includes processor 152 and memory 154 comprising device cable control instructions 156 configured to actuate the motor to rotate the device cable spool to change the length of the device cable extending from the power supply device as described further below. In some examples, one or more aspects of device cable control instructions 156 can be stored in memory 110 and executable by processor 114 of computing device 102 actuate the motor to rotate the device cable spool to change the length of the device cable. Additional details regarding memory 110, processor 114, memory 154, processor 152, and other components and subsystems of power supply device 100 and computing device 102 are described further below with reference to FIG. 12.

Figure 3:
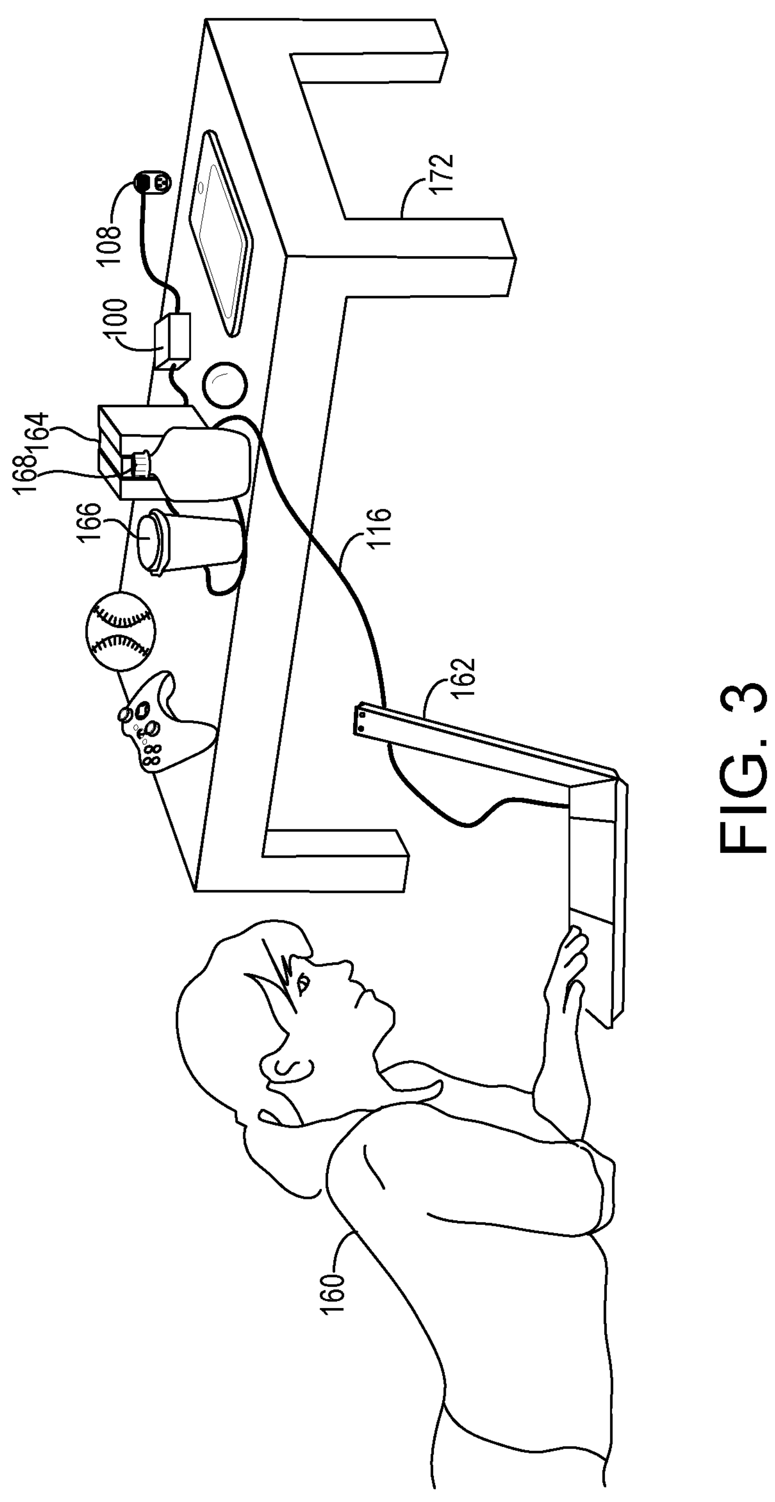
FIG. 3 shows one use case example of a power supply device according to examples of the present disclosure.

As noted above, in some use case environments a power supply with a device cable that is too long can create tangled, unsightly messes, tripping hazards, and other undesirable conditions. With reference now to FIG. 3, in this example a user 160 has plugged her laptop 162 into power receptacle 108 via power supply device 100. The device cable 116 is wound around books 164, coffee cup 166, and water bottle 168 on table 172, creating the potential for disrupting and damaging one or more items if the user 160 moves her laptop 162 or if the device cable is disturbed by another person or a pet. Accordingly, in one potential advantage of the present disclosure and as described further below, the power supply device 100 utilizes signals from one or more sensors to determine one or more cable properties of the device cable. Based at least in part on the cable property/properties of the device cable, the motor 140 in power supply device 100 is actuated to rotate the device cable spool 138 to change the length of the device cable 116, or is caused to cease changing the length of the device cable extending from the power supply device.

As noted above and with reference again to FIG. 2, in different embodiments and as described further below, the power supply device 100 can comprise one or more sensors configured to determine a cable property of the device cable. In some embodiments, the power supply device 100 comprises a force sensor 176. In some embodiments, the power supply device 100 comprises a strain gauge 178, such as a strain gauge located on device cable 116. In some embodiments, the power supply device 100 comprises an encoder 180. In some embodiments, the power supply device 100 comprises a force sensor 176 and a strain gauge 178. In some embodiments, the power supply device 100 comprises a force sensor 176 and an encoder 180. In some embodiments, the power supply device 100 comprises a strain gauge 178 and an encoder 180. In other embodiments, the power supply device 100 comprises any other sensor that can detect a cable property of the device cable, including but not limited to fiber optic sensors for detecting bending by measuring a change in light transmission properties, magnetic sensors for detecting bending in a device cable carrying electric current by determining changes in a magnetic field, etc.

Figure 4A:
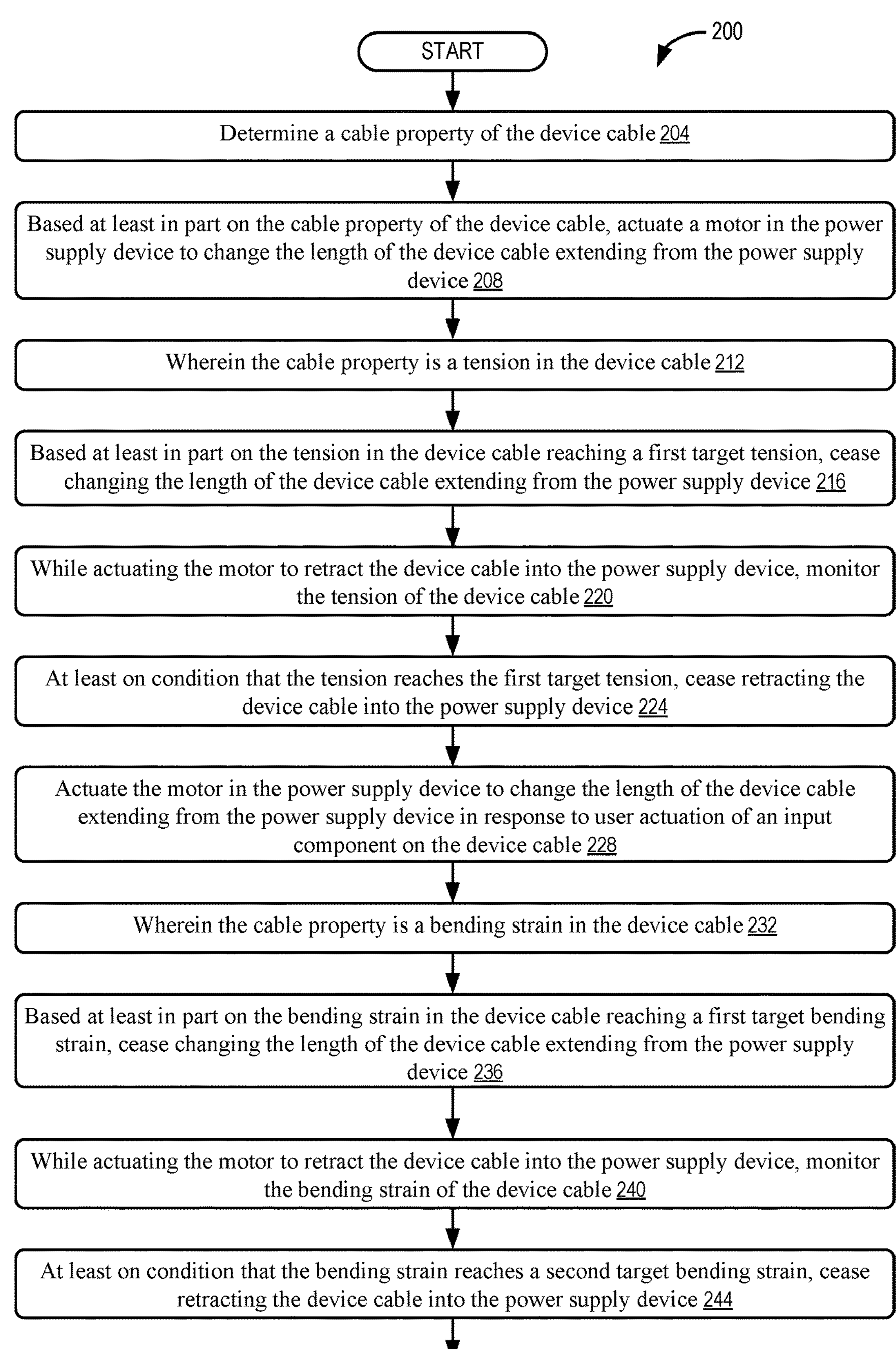
FIGS. 4A-4B illustrate a method for adjusting the length of a device cable extending from a power supply device according to examples of the present disclosure.
Figure 4B:
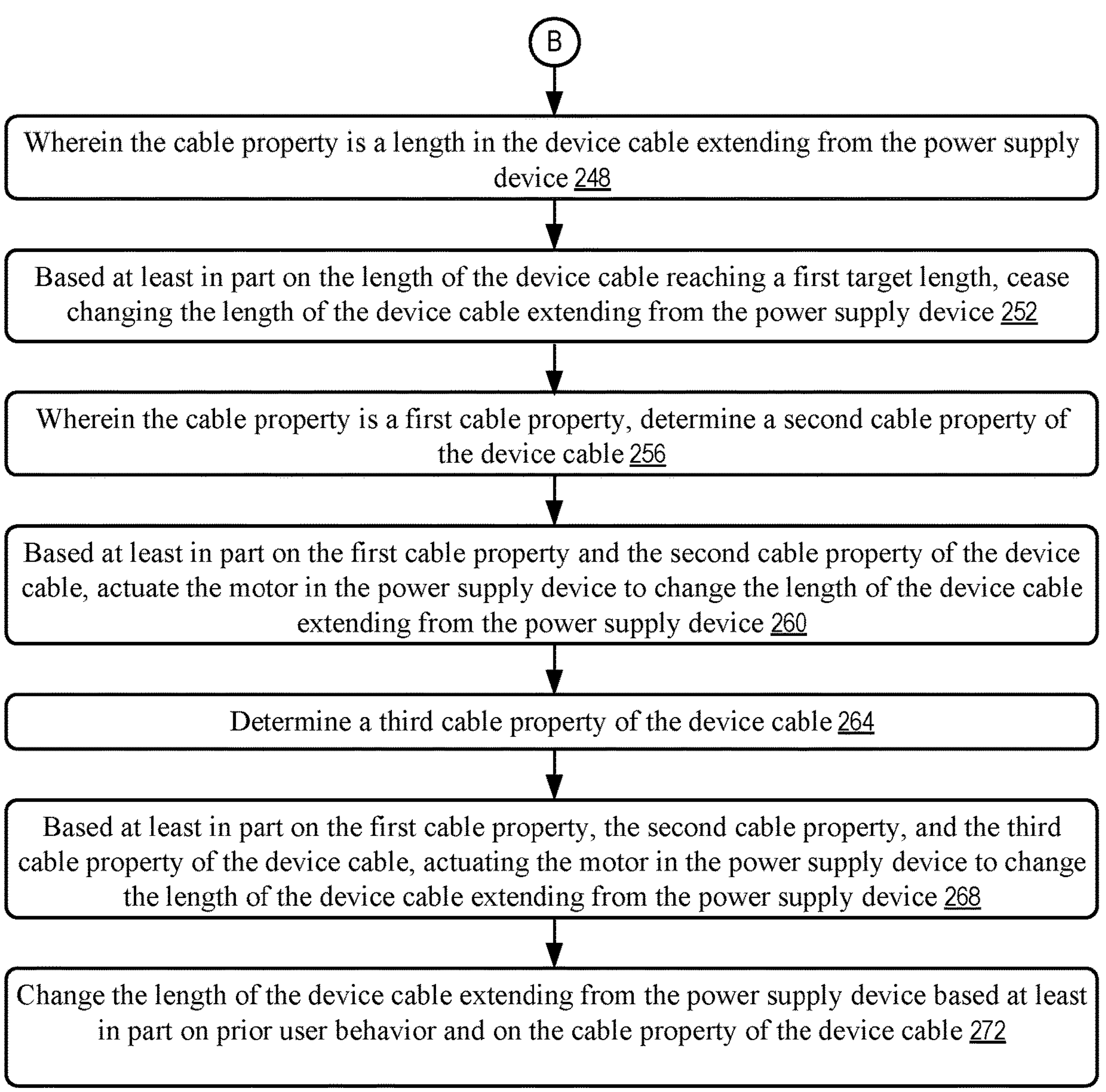
Figure 5:
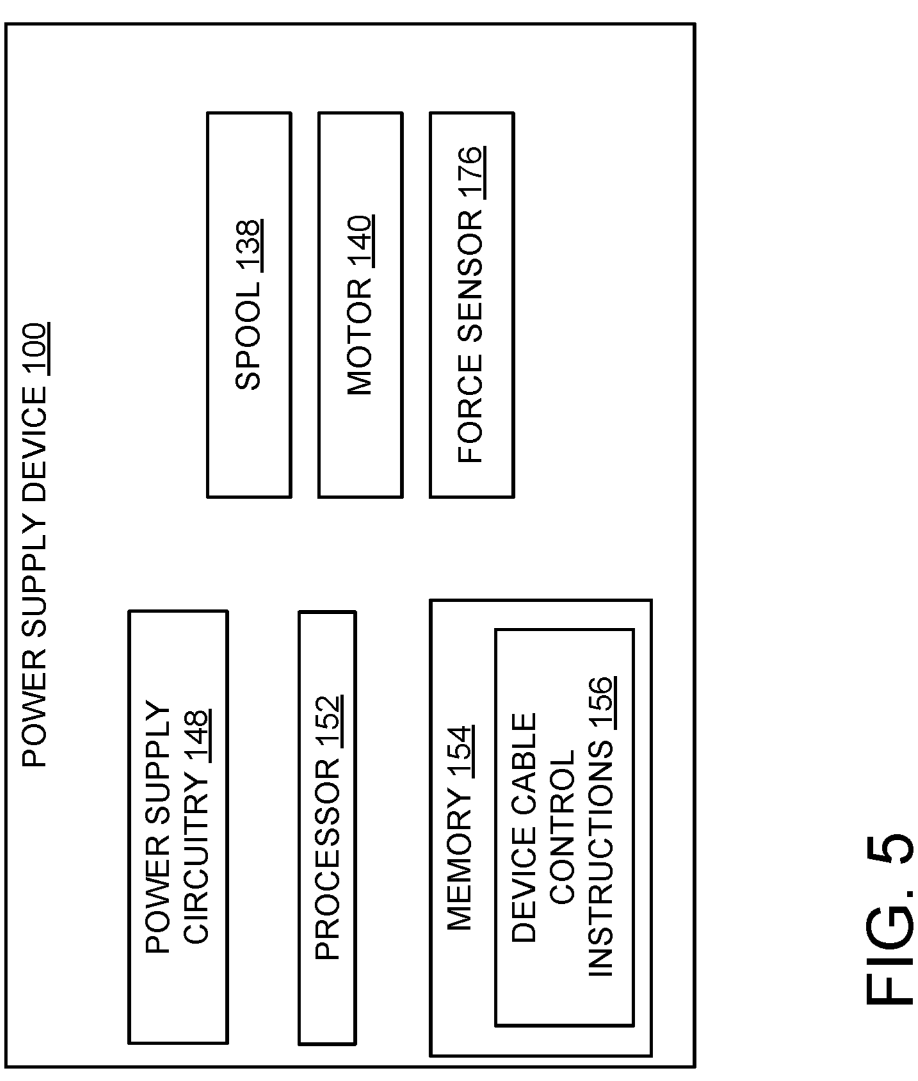
FIG. 5 shows a block diagram illustrating an example power supply device according to examples of the present disclosure.

With reference now to FIGS. 4A-4B, these figures illustrate a method 200 for adjusting a length of the device cable extending from the power supply device according to examples of the present disclosure. In some examples method 200 may be performed by power supply device 100 and device control instructions 156. The following description of method 200 is provided with reference to the components described herein and shown in FIGS. 1-3 and 5-11. It will be appreciated that method 200 also may be performed in other contexts using other suitable components.

With reference to FIG. 4A and as described further below, at 204 method 200 includes determining a cable property of the device cable. At 208 method 200 includes, based at least in part on the cable property of the device cable, actuating a motor in the power supply device to change the length of the device cable extending from the power supply device. At 212 method 200 includes, wherein the cable property is a tension in the device cable. In one example and with reference now to FIG. 5, power supply device 100 includes force sensor 176 configured to measure a tension in the device cable 116. In some examples the force sensor 176 comprises a rotary torque sensor that is coupled to motor 140 and configured to determine a torque experienced by the motor. Such torque corresponds to a magnitude of tension in the device cable 116. In other examples other configurations of force sensors can be coupled to motor 140 to determine a tension experienced by device cable 116.

Figure 6:
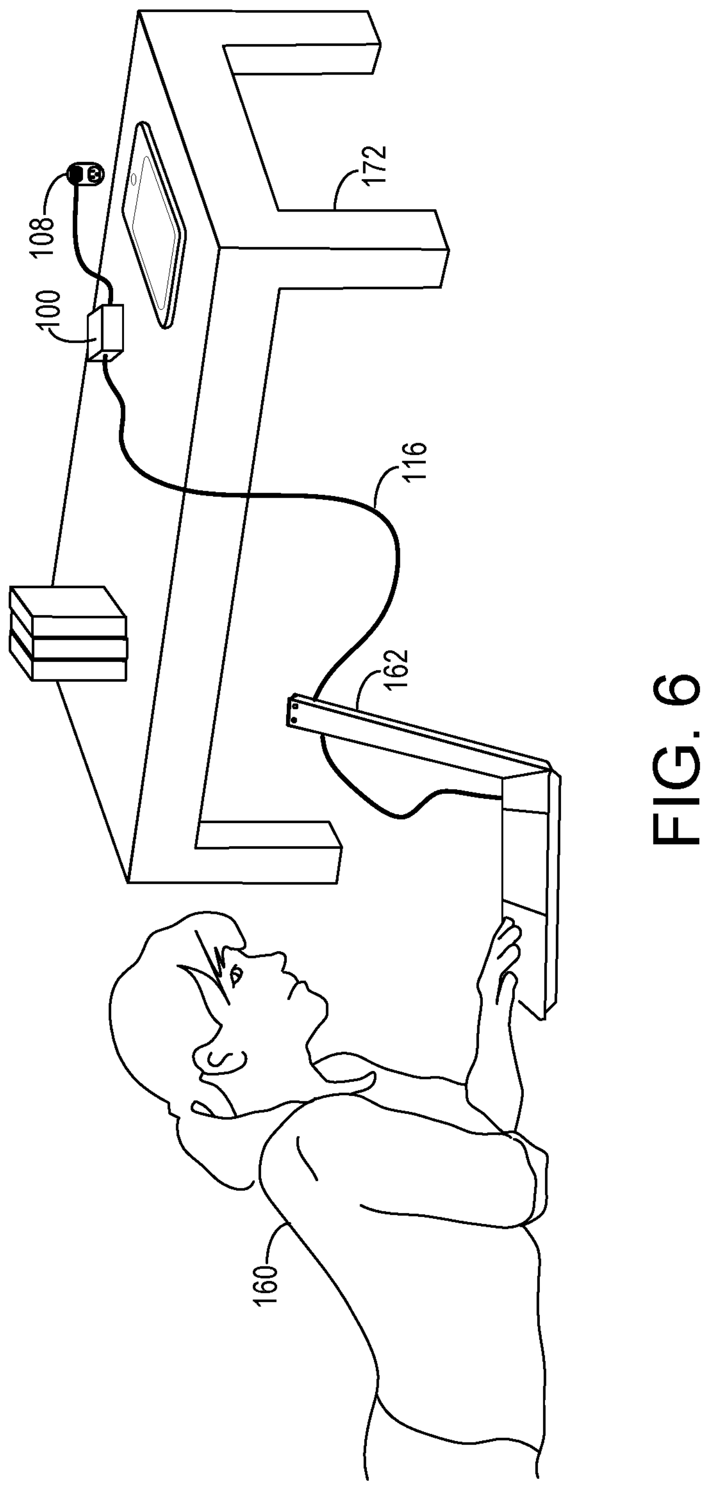
FIGS. 6 and 7 show another use case example of a power supply device according to examples of the present disclosure.
Figure 7:
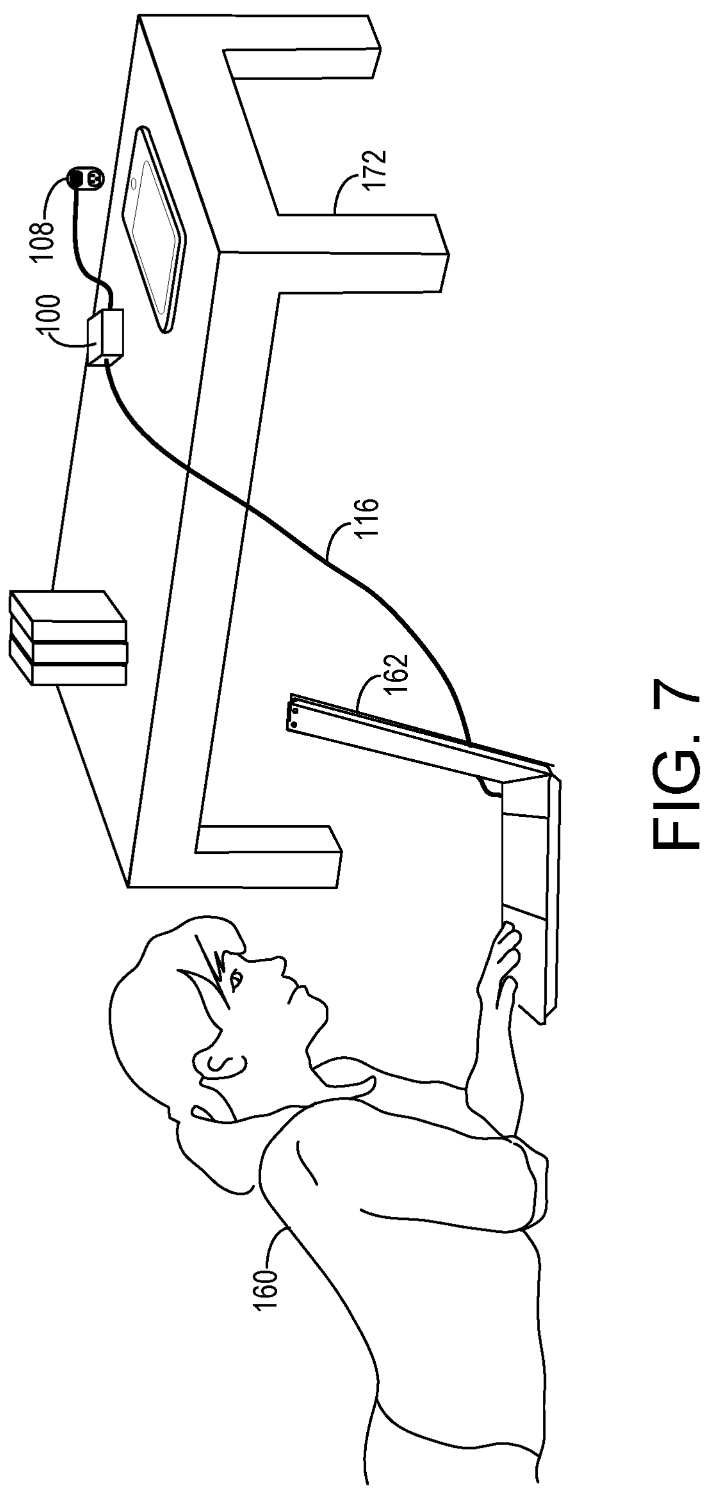

With reference now to FIG. 6, in one use case example user 160 has extended a significant amount of device cable 116 from the power supply device 100 and has plugged device connector 118 into her laptop 162. In some examples the motor 140 is a two-way motor configured to extend and retract the device cable 116 from the power supply device 100. In this example, upon connecting the cable connector to the laptop, the power supply device 100 receives a connection signal from the laptop 162 indicating that the cable connector has been plugged into the laptop. Based at least on receiving this connection signal and with reference now to FIG. 7, the device cable control instructions 156 actuate the motor 140 in the power supply device 100 to retract a portion of the device cable 116 into the power supply device and thereby advantageously reduce the length of cable between the laptop 162 and power supply device. In this manner, extraneous lengths of device cable 116 are reduced and conditions potentially conducive to accidental catching and pulling of the device cable 116 and corresponding mishaps can be reduced.

In some examples and with reference again to FIG. 4A, at 216 method 200 includes, based at least in part on the tension in the device cable reaching a first target tension, ceasing the changing of the length of the device cable extending from the power supply device. In one example and at 220 method 200 includes, while actuating the motor to retract the device cable into the power supply device, monitoring the tension of the device cable. In the above example, motor 140 can rotate the spool 138 to retract the device cable 116 into the power supply device 100 while monitoring the tension of the cable with the force sensor 176. With reference again to FIG. 4A, at 224 method 200 includes, at least on condition that the tension reaches the first target tension, ceasing retracting the device cable into the power supply device.

In the present example, when the tension reaches a predetermined target tension, device cable control instructions 156 cause the motor to cease rotating the spool 138. In different examples and use case environments, a variety of different target tensions can be utilized. In some examples, a user can adjust the target tension via a user interface provided by the operating system of the laptop computer. Advantageously, in this manner the power supply device 100 ensures that extraneous and unnecessary lengths of cable extending from the power supply device are effectively reduced, while also protecting the device cable and its connectors from potentially damaging higher tensions and corresponding mechanical stresses.

In some examples, and in another potential advantage of the present disclosure, when the device connector is disconnected from the computing device, device cable control instructions 156 cause the motor 140 to retract the device cable 116 fully or substantially fully into the enclosure 112 leaving the connector 118 exterior to the enclosure. In one example, device cable control instructions 156 determine that connector 118 has been disconnected via the absence of a connection signal normally received from the laptop when the connector is connected. Based at least on determining that connector 118 has been disconnected, device cable control instructions 156 actuate motor 140 to retract the device cable 116 fully or substantially fully into the enclosure 112. Advantageously, these examples substantially reduce the presence of extraneous and loose device cable when the power supply device 100 is not be used to charge a computing device.

In some examples, at 228 method 200 includes actuating the motor in the power supply device to change the length of the device cable extending from the power supply device in response to user actuation of an input component on the device cable. In one example and with reference again to FIG. 1, power supply device 100 includes a manually-operated button 126 located on connector 118 that allows manual actuation of the motor to change the length of the device cable. For example, button 126 can be configured to actuate motor 140 in response to user touching and holding the button for a predetermined period, such as 1.5 seconds. In one potential advantage of this configuration, while manually operating the motor 140 to retract the device cable 116, the user can observe the cable retracting and stop the retraction when the cable reaches a desired length.

Figure 8:
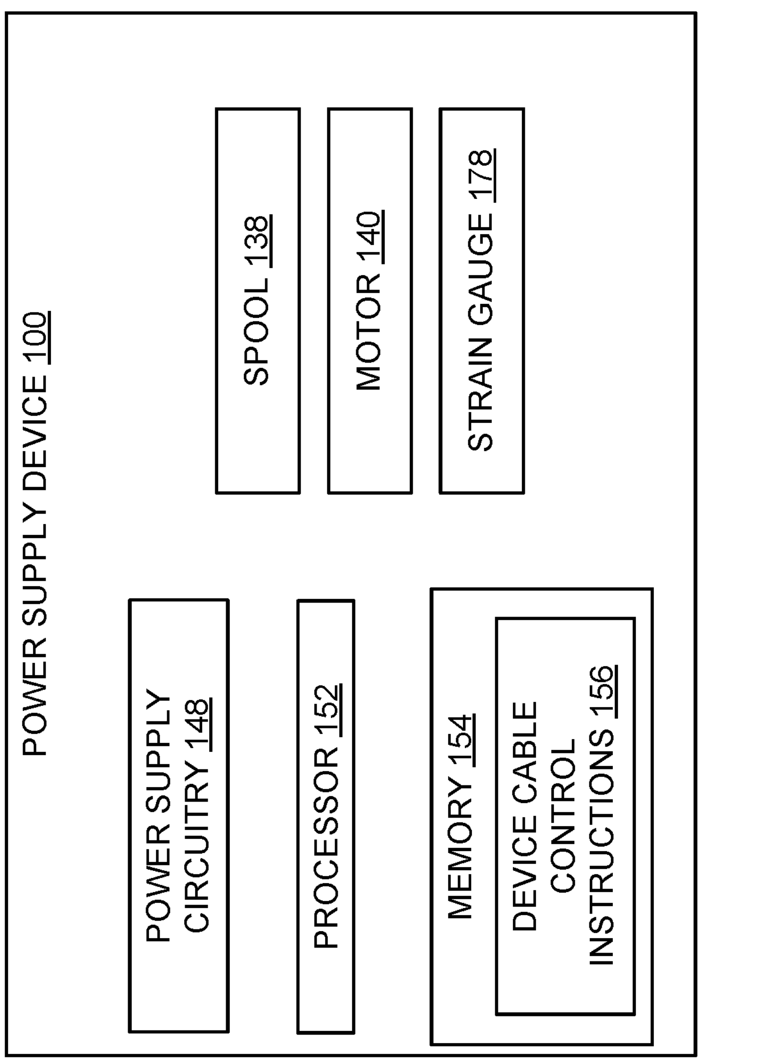
FIG. 8 shows a block diagram illustrating an example power supply device according to examples of the present disclosure.
Figure 9:
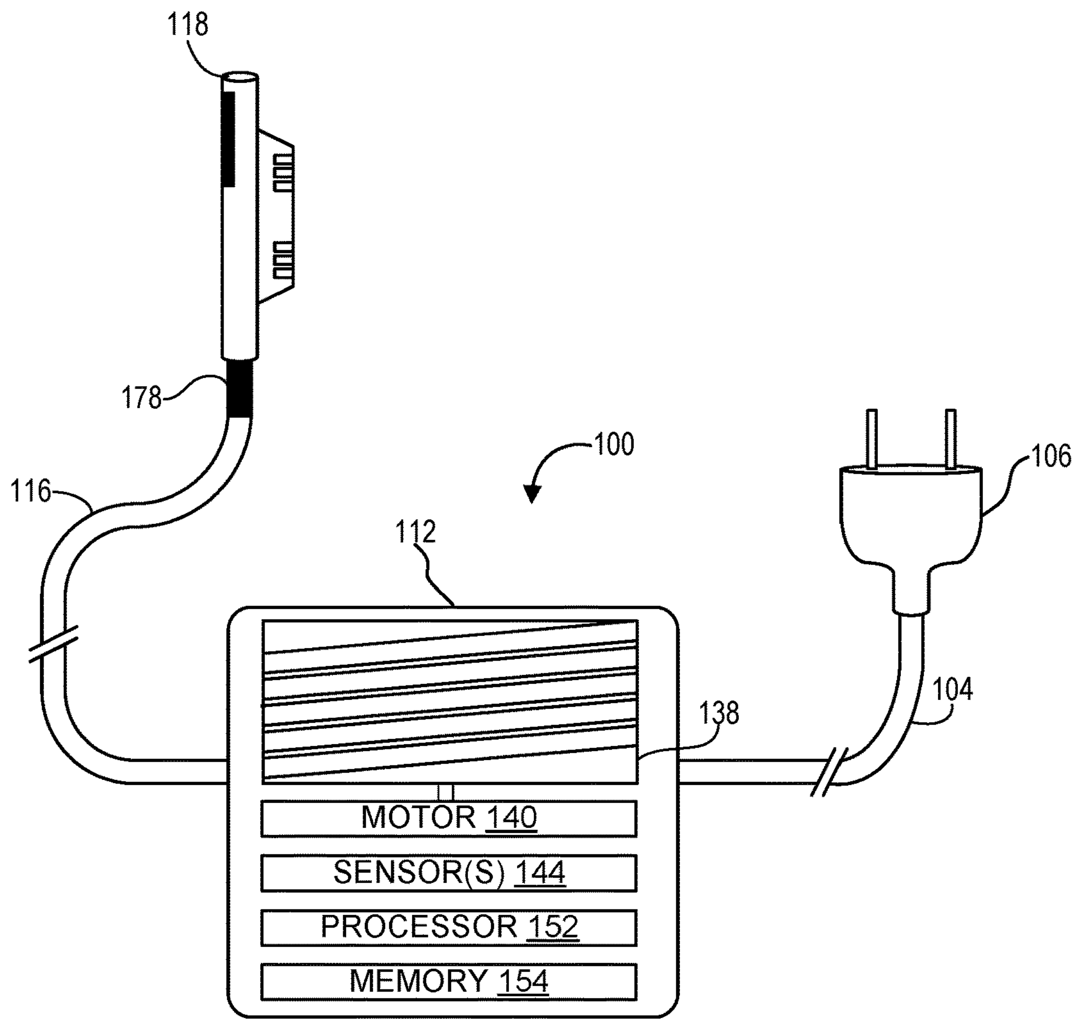
FIG. 9 shows another example of a power supply device according to examples of the present disclosure.
Figure 10:
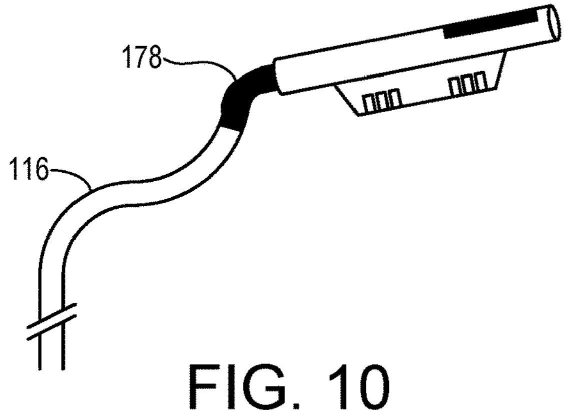
FIG. 10 shows one end of the device cable of the power supply device of FIG. 9.

With again to FIG. 4A, in some examples at 232 method 200 includes determining a cable property of the device cable in which the cable property is a bending strain in the device cable. In different examples the bending strain can be utilized to determine any bend or kink in the device cable 116. With reference now to FIG. 8, in some examples power supply device 100 includes a strain gauge 178 configured to determine a bending strain exerted on the device cable 116. In one example shown in FIGS. 9 and 10, device cable 116 includes a strain gauge 178 located at a distal end of the cable adjacent to connector 118. In other examples, one or more strain gauges can be located at different positions on device cable 116 and/or inside enclosure 112.

In some examples and as described above, upon connecting the device connector 118 to a computing device, the power supply device 100 receives a connection signal from the computing device indicating that the cable connector has been plugged into the computing device. Based at least on receiving this connection signal, the device cable control instructions 156 actuate the motor 140 in the power supply device 100 to retract a portion of the device cable 116 into the power supply device and thereby advantageously reduce the length of cable between the computing device and power supply device. In some examples and with reference again to FIG. 4A, at 236 method 200 includes, based at least in part on the bending strain in the device cable reaching a first target bending strain, ceasing the changing of the length of the device cable extending from the power supply device.

In one example and at 240 method 200 includes, while actuating the motor to retract the device cable into the power supply device, monitoring the bending strain of the device cable. In the above example, motor 140 can rotate the spool 138 to retract the device cable 116 into the power supply device 100 while monitoring the bending strain of the cable via signals from strain gauge 178. At 244 method 200 includes, at least on condition that the bending strain reaches a second target bending strain, ceasing the retraction of the device cable into the power supply device.

In the present example, when the bending strain reaches a predetermined target bending strain, device cable control instructions 156 cause the motor to cease rotating the spool 138. In different examples and use case environments, a variety of different target bending strains can be utilized. In some examples, a user can adjust the target bending strain via a user interface provided by the operating system of the laptop computer. Advantageously, in this manner the power supply device 100 ensures that extraneous and unnecessary lengths of cable extending from the power supply device are effectively reduced, while also protecting the device cable and connector from potentially damaging higher bending strain forces.

Figure 11:
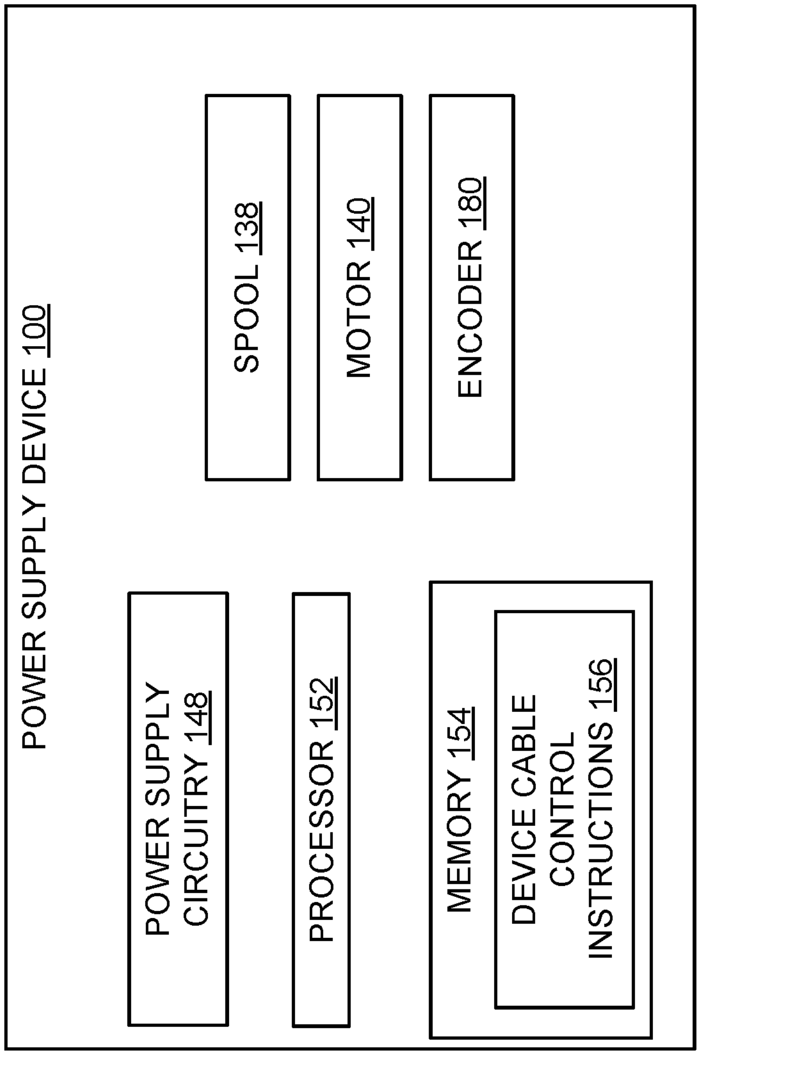
FIG. 11 shows a block diagram illustrating an example power supply device according to examples of the present disclosure.

With reference now to FIG. 4B, in some examples at 248 method 200 includes determining a cable property of the device cable where the cable property is a length of the device cable. With reference now to FIG. 11, in some examples power supply device 100 includes an encoder 180 coupled to motor 140. Using signals from encoder 180 the device cable control instructions 156 can determine a length of the device cable 116 that is extending from the enclosure 112. In one example and as noted above, upon connecting the device connector 118 to a computing device the power supply device 100 receives a connection signal from the computing device indicating that the cable connector has been plugged into the device. Based at least on receiving this connection signal, the device cable control instructions 156 actuate the motor 140 in the power supply device 100 to either extend or retract the device cable 116 until the length of the device cable extending from the enclosure 112 reaches a predetermined length. In this manner, regardless of a starting length of the device cable 116 extending from the enclosure 112, when the cable is connected to a computing device the device cable control instructions 156 control the motor 140 to extend or retract the cable to a desired, predetermined length.

In some examples and with reference again to FIG. 4B, at 252 method 200 includes, based at least in part on the length of the device cable reaching a first target length, ceasing the changing of the length of the device cable extending from the power supply device. In one example, while actuating the motor to retract the device cable into the power supply device, the device cable control instructions 156 monitor the length of the device cable extending from the enclosure 112 via signals from encoder 180. When the length reaches a predetermined target length, device cable control instructions 156 cause the motor to cease rotating the spool 138. In different examples and use case environments, a variety of different target lengths can be utilized. In some examples, a user can adjust the target length via a user interface provided by the operating system of the laptop computer. Advantageously, in this manner the power supply device 100 ensures that a consistent, predetermined length of cable extending from the power supply device is utilized.

In some examples of the present disclosure and as noted above, power supply device 100 utilizes signals from two sensors to determine two cable properties of the device cable. Based at least in part on the two cable properties of the device cable, the motor 140 in power supply device 100 is actuated to rotate the device cable spool 138 to change the length of the device cable 116. Accordingly, and with reference again to FIG. 4B, at 256 method 200 includes, wherein the cable property is a first cable property, determining a second cable property of the device cable. At 260 method 200 includes, based at least in part on the first cable property and the second cable property of the device cable, actuating the motor in the power supply device to change the length of the device cable extending from the power supply device.

For example and in some examples, power supply device 100 includes force sensor 176 for determining tension in the device cable 116 and strain gauge 178 for determining bending strain in the device cable. In different examples, various combinations of one or more predetermined target tensions and one or more predetermined target bending strains can be utilized by device cable control instructions 156 to actuate the motor in the power supply device to change the length of the device cable extending from the power supply device. For example, a first target tension and a first target bending strain can be utilized. The device cable control instructions 156 monitor the tension and the bending strain on device cable 116 as the motor retracts the cable into the enclosure.

In one example, while the motor 140 is retracting the device cable 116 and either the determined tension on device cable 116 exceeds the first target tension or the determined bending strain on device cable 116 exceeds the first target bending strain, the device cable control instructions 156 cause the motor to cease retracting the device cable. In another example, while the motor 140 is retracting the device cable 116 and both the determined tension on device cable 116 is less than or equal to the first target tension and the determined bending strain on device cable 116 is less than or equal to the first target bending strain, the device cable control instructions 156 cause the motor to continue retracting the device cable.

In other examples, power supply device 100 includes force sensor 176 for determining tension in the device cable 116 and encoder 180 for determining a length of device cable extending from the enclosure. In different examples, various combinations of one or more predetermined target tensions and one or more predetermined target lengths can be utilized by device cable control instructions 156 to actuate the motor in the power supply device to change the length of the device cable extending from the power supply device. In still other examples, power supply device 100 includes strain gauge 178 for determining s bending train in the device cable 116 and encoder 180 for determining a length of device cable extending from the enclosure. In different examples, various combinations of one or more predetermined target bending strains and one or more predetermined target lengths can be utilized by device cable control instructions 156 to actuate the motor in the power supply device to change the length of the device cable extending from the power supply device. In other examples, cable properties determined by other types of sensors can be utilized in combination to actuate the motor in the power supply device to change the length of the device cable extending from the power supply device. In one potential advantage of using combinations of cable properties determined by two or more sensors to actuate the motor in the power supply device to change the length of the device cable, particular use cases corresponding to multiple cable properties can be addressed.

In some examples, power supply device 100 utilizes signals from three sensors to determine three cable properties of the device cable. Based at least in part on the three cable properties of the device cable, the motor 140 in power supply device 100 is actuated to rotate the device cable spool 138 to change the length of the device cable 116. Accordingly, and with reference again to FIG. 4B, at 264 method 200 includes determining a third cable property of the device cable. At 268 method 200 includes, based at least in part on the first cable property, the second cable property, and the third cable property of the device cable, actuating the motor in the power supply device to change the length of the device cable extending from the power supply device.

In some examples, power supply device 100 includes force sensor 176, for determining tension in the device cable 116, strain gauge 178 for determining bending strain in the device cable, and encoder 180 for determining the length of cable extending from the enclosure. In different examples, various combinations of one or more predetermined target tensions, one or more predetermined target bending strains, and one or more predetermined target lengths can be utilized by device cable control instructions 156 to actuate the motor in the power supply device to change the length of the device cable extending from the power supply device. For example, a first target tension, a first target bending strain, and a first target length can be utilized. The device cable control instructions 156 monitor the tension, bending strain, and length of device cable 116 as the motor retracts the cable into the enclosure.

In one example, at one point while the motor 140 is retracting the device cable 116, the determined tension on device cable 116 is less than or equal to the first target tension and the determined bending strain on device cable 116 is less than or equal to the first target bending strain. However, using signals from the encoder 180 the device cable control instructions 156 determine that the length of the device cable extending from the enclosure reaches a predetermined target length. In this example, based at least on determining that the length of the device cable reaches the predetermined target length, device cable control instructions 156 cause the motor to cease retracting the device cable.

In different examples, various combinations of one or more predetermined target tensions, one or more predetermined target bending strains, and one or more predetermined target lengths can be utilized by device cable control instructions 156 to actuate the motor in the power supply device to change the length of the device cable extending from the power supply device. In other examples, cable properties determined by other types of sensors can be utilized in combination to actuate the motor in the power supply device to change the length of the device cable extending from the power supply device.

In some examples, device cable control instructions 156 can include one or more machine learning algorithms, such as one or more neural networks, configured to analyze user behavior and utilize such data to change the length of the device cable based at least in part on prior user behavior. Accordingly and at 272 method 200 can include changing the length of the device cable extending from the power supply device based at least in part on prior user behavior and on one or more cable properties of the device cable.

In one use case example, a user may regularly charge her mobile phone using power supply device 100. The mobile phone includes an accelerometer that measures phone movements. Frequently when the user is charging her phone, the user picks up the phone to send a text message, check social media accounts, or perform other actions. Over time the device cable control instructions 156 can learn that when the phone is being charged by the power supply device 100, the user picks up and interacts with the phone in 80% of the instances of charging. The device cable control instructions 156 can determine that such behavior in 80% of charging instances exceeds a predetermined target percentage, such as 50%. Based at least on determining that the user's behavior of picking up and interacting with the phone in 80% of the instances of charging exceeds the predetermined target percentage, the device cable control instructions 156 can increase the length of the device cable 116 extending from the power supply device 100 from a shorter, default length to ensure there is adequate cable slack that allows the user to easily pick up the phone during charging.

For example, the device cable control instructions 156 can normally adjust the length of the device cable 116 extending from the power supply device 100 during charging to a default length of 1.0 meters when the connector 118 is inserted into a mobile phone. In one example, based at least on determining that the user's behavior of picking up and interacting with the phone in 80% of the instances of charging exceeds the predetermined target percentage, the device cable control instructions 156 can modify the default length to 1.5 meters. Subsequently, when the device cable control instructions 156 determine that connector 118 of device cable 116 is inserted into a mobile phone, the instructions actuate motor 140 to increase the length of the device cable 116 extending from the power supply device 100 to 1.5 m. In one potential advantage of this example, extending the length of the device cable 116 during charging helps provide additional cable slack that allows the user to easily pick up the phone during charging without pulling the enclosure 112 of the power supply device 100. It will also be appreciated that numerous other examples of changing the length of the device cable extending from the power supply device based at least in part on prior user behavior and on one or more cable properties of the device cable are contemplated by and included in the present disclosure.

It will be appreciated that method 200 is provided by way of example and is not meant to be limiting. Therefore, it is to be understood that method 200 may include additional and/or alternative steps relative to those illustrated in FIGS. 4A and 4B. Further, it is to be understood that method 200 may be performed in any suitable order. Further still, it is to be understood that one or more steps may be omitted from method 200 without departing from the scope of this disclosure.

In some embodiments, the methods and processes described herein may be tied to a computing system of one or more computing devices. In particular, such methods and processes may be implemented as an executable computer-application program, a network-accessible computing service, an application-programming interface (API), a library, or a combination of the above and/or other compute resources.

Figure 12:
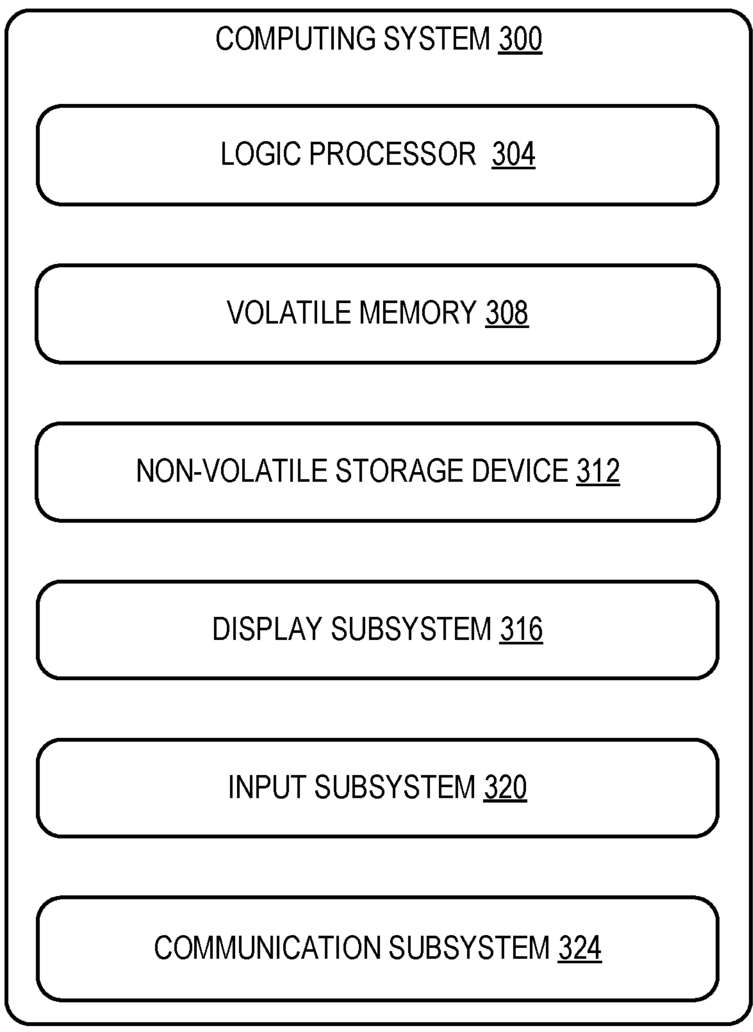
FIG. 12 shows a block diagram of an example computing system according to examples of the present disclosure.

FIG. 12 schematically shows a simplified representation of a computing system 300 configured to provide any to all of the compute functionality described herein. Computing system 300 may take the form of one or more personal computers, network-accessible server computers, tablet computers, home-entertainment computers, gaming devices, mobile computing devices, mobile communication devices (e.g., smart phone), virtual/augmented/mixed reality computing devices, wearable computing devices, Internet of Things (IoT) devices, embedded computing devices, and/or other computing devices. The power supply device 100 and computing device 102 described above may comprise computing system 300 or one or more aspects of computing system 300.

Computing system 300 includes a logic processor 304, volatile memory 308, and a non-volatile storage device 312. Computing system 300 may optionally include a display subsystem 316, input subsystem 320, communication subsystem 324, and/or other components not shown in FIG. 12.

Logic processor 304 includes one or more physical devices configured to execute instructions. For example, the logic processor may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic processor 304 may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 304 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 312 includes one or more physical devices configured to hold instructions executable by the logic processors to implement the methods and processes described herein. When such methods and processes are implemented, the state of non-volatile storage device 312 may be transformed—e.g., to hold different data.

Non-volatile storage device 312 may include physical devices that are removable and/or built-in. Non-volatile storage device 312 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 312 may include nonvolatile, dynamic, static, read/write, read-only, sequential-access, location-addressable, file-addressable, and/or content-addressable devices. It will be appreciated that non-volatile storage device 312 is configured to hold instructions even when power is cut to the non-volatile storage device 312.

Volatile memory 308 may include physical devices that include random access memory. Volatile memory 308 is typically utilized by logic processor 304 to temporarily store information during processing of software instructions. It will be appreciated that volatile memory 308 typically does not continue to store instructions when power is cut to the volatile memory 308.

Aspects of logic processor 304, volatile memory 308, and non-volatile storage device 312 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), microcontroller units (MCUs), and complex programmable logic devices (CPLDs), for example.

When included, display subsystem 316 may be used to present a visual representation of data held by non-volatile storage device 312. As the herein described methods and processes change the data held by the non-volatile storage device, and thus transform the state of the non-volatile storage device, the state of display subsystem 316 may likewise be transformed to visually represent changes in the underlying data. Display subsystem 316 may include one or more display devices utilizing virtually any type of technology. Such display devices may be combined with logic processor 304, volatile memory 308, and/or non-volatile storage device 312 in a shared enclosure, or such display devices may be peripheral display devices.

When included, input subsystem 320 may comprise or interface with one or more user-input devices such as a stylus, trackpad, keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 324 may be configured to communicatively couple various computing devices described herein with each other, and with other devices. Communication subsystem 324 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 300 to send and/or receive messages to and/or from other devices via a network such as the Internet.

This disclosure is presented by way of example and with reference to the associated drawing figures. Components, process steps, and other elements that may be substantially the same in one or more of the figures are identified coordinately and are described with minimal repetition. It will be noted, however, that elements identified coordinately may also differ to some degree. It will be further noted that some figures may be schematic and not drawn to scale. The various drawing scales, aspect ratios, and numbers of components shown in the figures may be purposely distorted to make certain features or relationships easier to see.

The following paragraphs provide additional support for the claims of the subject application. One aspect provides at a power supply device comprising a device cable, a method for adjusting a length of the device cable extending from the power supply device, the method comprising: determining a cable property of the device cable; and based at least in part on the cable property of the device cable, actuating a motor in the power supply device to change the length of the device cable extending from the power supply device. The method may additionally or alternatively include, wherein the cable property is a tension in the device cable. The method may additionally or alternatively include, based at least in part on the tension in the device cable reaching a first target tension, ceasing changing the length of the device cable extending from the power supply device. The method may additionally or alternatively include, while actuating the motor to retract the device cable into the power supply device, monitoring the tension of the device cable; and at least on condition that the tension reaches the first target tension, ceasing retracting the device cable into the power supply device. The method may additionally or alternatively include, wherein the cable property is a bending strain in the device cable. The method may additionally or alternatively include, based at least in part on the bending strain in the device cable reaching a first target bending strain, ceasing changing the length of the device cable extending from the power supply device. The method may additionally or alternatively include, while actuating the motor to retract the device cable into the power supply device, monitoring the bending strain of the device cable; and at least on condition that the bending strain reaches the first target bending strain, ceasing retracting the device cable into the power supply device. The method may additionally or alternatively include, wherein the cable property is the length of the device cable extending from the power supply device. The method may additionally or alternatively include, based at least in part on the length of the device cable reaching a first target length, ceasing changing the length of the device cable extending from the power supply device. The method may additionally or alternatively include, wherein the cable property is a first cable property, determining a second cable property of the device cable; and based at least in part on the first cable property and the second cable property of the device cable, actuating the motor in the power supply device to change the length of the device cable extending from the power supply device. The method may additionally or alternatively include, determining a third cable property of the device cable; and based at least in part on the first cable property, the second cable property, and the third cable property of the device cable, actuating the motor in the power supply device to change the length of the device cable extending from the power supply device. The method may additionally or alternatively include, changing the length of the device cable extending from the power supply device based at least in part on prior user behavior and on the cable property of the device cable. The method may additionally or alternatively include, actuating the motor in the power supply device to change the length of the device cable extending from the power supply device in response to user actuation of an input component on the device cable.

Another aspect provides a power supply device, comprising: an enclosure; a device cable spool in the enclosure; a device cable affixed to the device cable spool and extending from the enclosure; a motor coupled to the device cable spool; a processor; and memory storing instructions executable by the processor to: determine a cable property of the device cable; and based at least in part on the cable property of the device cable, actuate the motor to rotate the device cable spool to change a length of the device cable extending from the enclosure. The power supply device may additionally or alternatively include, wherein the cable property is a tension in the device cable. The power supply device may additionally or alternatively include, wherein the instructions are executable to cease rotating the device cable spool when the tension in the device cable reaches a first target tension. The power supply device may additionally or alternatively include, wherein the cable property is a bending strain in the device cable. The power supply device may additionally or alternatively include, wherein the instructions are executable to cease rotating the device cable spool when the bending strain in the device cable reaches a first target bending strain. The power supply device may additionally or alternatively include, wherein the cable property is a first cable property, and the instructions are executable to: determine a second cable property of the device cable; and based at least in part on the first cable property and the second cable property of the device cable, actuate the motor in the power supply device to rotate the device cable spool to change the length of the device cable extending from the enclosure.

Another aspect provides, at a power supply device comprising a device cable and a force sensor, the device cable comprising a strain gauge, a method for adjusting a length of the device cable, the method comprising: utilizing the force sensor to determine a tension of the device cable; utilizing the strain gauge to determine a bending strain of the device cable; and based at least in part on the tension and the bending strain of the device cable, actuating a motor in the power supply device to change the length of the device cable extending from the power supply device.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. At a power supply device comprising a device cable, a method for adjusting a length of the device cable extending from the power supply device, the method comprising:

determining a cable property of the device cable;

based at least in part on the cable property of the device cable, actuating a motor in the power supply device to retract the device cable into the power supply device; and based at least in part on a bending strain of the device cable reaching a target bending strain, ceasing retracting the device cable into the power supply device.

2. The method of claim 1, wherein the cable property is a tension in the device cable.

3. The method of claim 2, further comprising, based at least in part on the tension in the device cable reaching a first target tension, ceasing retracting the device cable into the power supply device.

4. The method of claim 1, wherein the cable property is the bending strain in the device cable.

5. The method of claim 1, wherein the cable property is the length of the device cable extending from the power supply device.

6. The method of claim 5, further comprising, based at least in part on the length of the device cable reaching a first target length, ceasing retracting the device cable into the power supply device.

7. The method of claim 1, wherein the cable property is a first cable property, the method further comprising:

determining a second cable property of the device cable; and based at least in part on the first cable property and the second cable property of the device cable, ceasing retracting the device cable into the power supply device.

8. The method of claim 7, further comprising:

determining a third cable property of the device cable; and based at least in part on the first cable property, the second cable property, and the third cable property of the device cable, ceasing retracting the device cable into the power supply device.

9. The method of claim 1, further comprising changing the length of the device cable extending from the power supply device based at least in part on prior user behavior and on the cable property of the device cable.

10. The method of claim 1, further comprising actuating the motor in the power supply device to change the length of the device cable extending from the power supply device in response to user actuation of an input component on the device cable.

11. A power supply device, comprising:

an enclosure;

a device cable spool in the enclosure;

a device cable affixed to the device cable spool and extending from the enclosure;

a motor coupled to the device cable spool;

a processor; and memory storing instructions executable by the processor to:

determine a cable property of the device cable;

based at least in part on the cable property of the device cable, actuate the motor to rotate the device cable spool to retract the device cable into the power supply device; and based at least in part on a bending strain of the device cable reaching a target bending strain, cease retracting the device cable into the power supply device.

12. The power supply device of claim 11, wherein the cable property is a tension in the device cable.

13. The power supply device of claim 12, wherein the instructions are executable to cease retracting the device cable into the power supply device when the tension in the device cable reaches a first target tension.

14. The power supply device of claim 11, wherein the cable property is the bending strain in the device cable.

15. The power supply device of claim 11, wherein the cable property is a first cable property, and the instructions are executable to:

determine a second cable property of the device cable; and based at least in part on the first cable property and the second cable property of the device cable, cease retracting the device cable into the enclosure.

16. The power supply device of claim 15, further comprising:

determining a third cable property of the device cable; and based at least in part on the first cable property, the second cable property, and the third cable property of the device cable, ceasing retracting the device cable into the power supply device.

17. The power supply device of claim 11, wherein the cable property is a length of the device cable extending from the power supply device.

18. The power supply device of claim 17, further comprising, based at least in part on the length of the device cable reaching a first target length, ceasing retracting the device cable into the power supply device.

19. The power supply device of claim 11, further comprising changing a length of the device cable extending from the power supply device based at least in part on prior user behavior and on the cable property of the device cable.

20. At a power supply device comprising a device cable and a force sensor, the device cable comprising a strain gauge, a method for adjusting a length of the device cable, the method comprising:

utilizing the force sensor to determine a tension of the device cable;

utilizing the strain gauge to determine a bending strain of the device cable; and based at least in part on the tension and the bending strain of the device cable, actuating a motor in the power supply device to change the length of the device cable extending from the power supply device.

* * * * *